US007061416B2

(12) United States Patent
Nagai

(10) Patent No.: US 7,061,416 B2
(45) Date of Patent: Jun. 13, 2006

(54) ADAPTIVE-TYPE SIGMA-DELTA A/D CONVERTER

(75) Inventor: Toshiaki Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/049,955

(22) Filed: Feb. 4, 2005

(65) Prior Publication Data
US 2006/0097899 A1 May 11, 2006

(30) Foreign Application Priority Data
Nov. 10, 2004 (JP) ............................. 2004-326578

(51) Int. Cl.
*H03M 3/00* (2006.01)
(52) U.S. Cl. ..................................... 341/143; 341/172
(58) Field of Classification Search ................ 341/143, 341/142, 172, 118, 120, 155
See application file for complete search history.

(56) References Cited

U.S. PATENT DOCUMENTS

| 5,153,593 | A  | * | 10/1992 | Walden et al.     | 341/143 |
| 6,037,887 | A  | * | 3/2000  | Wu et al.         | 341/143 |
| 6,278,750 | B1 | * | 8/2001  | Yu                | 375/345 |
| 6,567,025 | B1 | * | 5/2003  | Schreier et al.   | 341/143 |
| 6,653,960 | B1 | * | 11/2003 | Mitamura et al.   | 341/143 |
| 6,693,573 | B1 | * | 2/2004  | Linder            | 341/143 |
| 6,822,592 | B1 | * | 11/2004 | Gandolfi et al.   | 341/143 |

OTHER PUBLICATIONS

"Sigma Delta Analog to Digital Converters with Adaptive Quantization", Ramesh et al, *Proceedings of the 40th Midwest Symposium on Circuits and Systems*, vol. 1, pp. 22-25, 1997, no month.

"Adaptive Sigma-Delta Modulation with One-Bit Quantization", Zierhofer, *IEEE Transactions on Circuits and Systems II: Analog to Digital Signal Processing*, vol. 47, No. 5, pp. 408-415, May 2000.

* cited by examiner

*Primary Examiner*—Linh V. Nguyen
(74) *Attorney, Agent, or Firm*—Arent Fox PLLC

(57) ABSTRACT

A sigma-delta A/D converter includes an A/D converter configured to output a digital signal, a signal-magnitude detecting circuit coupled to the output of the A/D converter to output a control signal responsive to a magnitude indicated by the digital signal, a D/A converter coupled to the output of the A/D converter and the output of the signal-magnitude detecting circuit to output an analog signal having a signal level responsive to the digital signal and the control signal, a differential circuit coupled to an external analog input and the output of the D/A converter to output a differential between the external analog input and the analog signal, and a filter circuit to couple between the output of the differential circuit and an input of the A/D converter, wherein the D/A converter is configured to control, in response to the control signal, a capacitance of a capacitor that discharges following charging of electric charge to supply an electric current of the analog signal.

7 Claims, 9 Drawing Sheets

| DIGITAL OUTPUT | SIGN OF DAC OUTPUT | SELECTED DAC |
|---|---|---|
| 00 | NEGATIVE | DAC1, DAC2 |
| 01 | | DAC1 |
| 10 | POSITIVE | DAC1 |
| 11 | | DAC1, DAC2 |

ADAPTIVE-TYPE SIGMA-DELTA A/D CONVERTER

BACKGROUND OF THE INVENTION

1. Field of the Invention

The present invention generally relates to sigma-delta A/D converters, and particularly relates to a sigma-delta A/D converter that adaptively changes the amount of an analog signal feedback.

2. Description of the Related Art

Sigma-delta A/D converters obtain a differential between an analog input signal and a feedback signal fed back after the D/A conversion of the digital output, and performs an A/D conversion with respect to the differential signal after the integration thereof. The circuit portion that performs the A/D conversion of the differential signal after integration may be a low-precision A/D converter having a small number of output bits. For example, a comparator having one bit output may be used for this purpose. In this case, the one-bit digital output of the comparator is D/A-converted and fed back, and a differential between the feedback signal and the analog input signal is obtained and integrated. The integration accumulates differences between the input and the output over time. When the accumulated difference between the input and the output over time exceeds the threshold of the comparator at some point in time, the output of the comparator is inverted.

The feedback signal made by performing D/A conversion on the output "1" of the comparator is 1 V, and the input signal is 0.75 V, for example. The differential, which is equal to −0.25 V, is accumulated through integration. The output of the comparator that receives the integrated signal as its input then changes from "1" to "0" at some point in time. The feed-back signal made by performing D/A conversion on the output "0" of the comparator is 0 V, for example. Since the input signal is 0.75 V, the difference is +0.75 V. The differential (+0.75V) is accumulated by integration. The output of the comparator that receives the integrated signal as its input then changes from "0" to "1" at some point in time. In this manner, the digital output alternates between "0" and "1".

A rate at which the integrated signal changes by integrating +0.75 V is three times greater than the rate at which the integrated signal changes by integrating −0.25V. As a result, the period during which +0.75 V is being accumulated, i.e., the period during which the digital output is "0", is one third of the period during which −0.25 V is being accumulated, i.e., the period during which the digital output is "1". The digital output that alternates between "0" and "1" thus has an average that is equal to 0.75, which precisely represents the input analog potential.

If the digital output is sampled, the sampled digital output in the above example becomes "111011101110 . . . ", for example. With the over-sampling of the digital output and the averaging by use of a FIR low-pass filter, therefore, the A/D conversion output is obtained with the precision commensurate with the over-sampling rate.

In this manner, the sigma-delta A/D converter provides high precision by its nature, and has an advantage in that most of the processing is performed digitally, with few analog-based parts.

FIG. 1 is a drawing showing the dynamic range of a sigma-delta A/D converter. In general, a sigma-delta A/D converter has a dynamic range characteristic as shown in FIG. 1A. The horizontal axis represents an analog input signal level, and the vertical axis represents an S/N ratio of the digital output signal.

When the analog input signal becomes greater than the range of the DAC feedback (i.e., the amount of the feedback that is obtained through the D/A conversion of the digital output), the feedback control operation as described above cannot be achieved. Because of this, the S/N ratio drops abruptly when the analog input signal level exceeds a predetermined level as shown in FIG. 1A. Further, if the range of the analog input signal becomes small compared to the predetermined precision of the A/D conversion, quantization noise increases comparatively, resulting in the deterioration of the S/N ratio. As shown in FIG. 1A, therefore, the dynamic range in which the sigma-delta A/D converter is operable is limited to a predetermined range of the analog input signal.

Conventional means for providing a wider dynamic range for the sigma-delta A/D converter include increasing an order of the loop filter (i.e., the filter for integrating the differential signal), increasing the over-sampling rate, increasing the number of feedback loops, increasing the number of bits of the A/D converter and D/A converter (DAC: digital-to-analog converter) used in the feedback loop, etc. Such means, however, result an increase in circuit complexity, an increase in power consumption, etc.

Another method for achieving a wider dynamic range by taking a completely different approach than the above means is an adaptive-type sigma-delta A/D converter (Non-patent Documents 1 and 2). In general, a probable range of an input signal during a predetermined time period is narrower than the range of all the possible values of the input signal. In the adaptive-type sigma-delta A/D converter, the input/output characteristic of the sigma-delta A/D converter is adaptively changed according to the input signal level at each point in time, thereby achieving a wider dynamic range. Namely, when the analog input signal level is low, the amount of the DAC feedback is reduced to suppress quantization noise comparatively. When the analog input signal level is high, the amount of the DAC feedback is increased, thereby shifting the properly operable range toward a higher analog input signal level. With this provision, it is possible to achieve a wider dynamic range adaptively as shown in FIG. 1B.

[Non-patent Document 1]

N. C. Ramech and K. S. Chao, "Sigma Delta Analog to Digital Converters with Adaptive Quantization," Proceedings of the 40 the Midwest Symposium on Circuits and Systems, Vol 1, p. 22–25, 1997

[Non-patent Document 2]

Zierhofer, C. M "Adaptive sigma-delta modulation with one-bit quantization," IEEE Transactions on Circuits and Systems II: Analog and Digital Signal Processing, Vol. 47, No. 5, p. 408–415, May 2000

The measures such as increasing the number of bits of the A/D converter and D/A converter have a problem in that the circuit construction becomes complex. In the adaptive-type sigma-delta A/D converter, also, it is not desirable to have a circuit construction becoming complex because of the control of the amount of the DAC feedback. Accordingly, it is desirable to achieve the control of the amount of the DAC feedback by a simple circuit construction that is made by adding only a slight modification to the existing circuit configuration of non-adaptive-type sigma-delta A/D converters.

Accordingly, there is a need for an adaptive-type sigma-delta A/D converter that can control the amount of the DAC feedback by use of a simple modification added to the circuit construction of a non-adaptive-type sigma-delta A/D converter.

SUMMARY OF THE INVENTION

It is a general object of the present invention to provide a sigma-delta A/D converter that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a sigma-delta A/D converter particularly pointed out in the specification in such full, clear, concise, and exact terms as to enable a person having ordinary skill in the art to practice the invention.

To achieve these and other advantages in accordance with the purpose of the invention, the invention provides a sigma-delta A/D converter, which includes an A/D converter configured to output a digital signal, a signal-magnitude detecting circuit coupled to the output of the A/D converter to output a control signal responsive to a magnitude indicated by the digital signal, a D/A converter coupled to the output of the A/D converter and the output of the signal-magnitude detecting circuit to output an analog signal having a signal level responsive to the digital signal and the control signal, a differential circuit coupled to an external analog input and the output of the D/A converter to output a differential between the external analog input and the analog signal, and a filter circuit to couple between the output of the differential circuit and an input of the A/D converter, wherein the D/A converter is configured to control, in response to the control signal, a capacitance of a capacitor that discharges following charging of electric charge to supply an electric current of the analog signal.

According to at least one embodiment of the present invention, the D/A converter for the feedback purpose provided in the sigma-delta A/D converter is configured such that the capacitance of the capacitor for generating the feedback current through charging/discharging is controllable. This may be achieved by selecting some of the plurality of capacitors through capacitor selecting switches and by generating the feedback current by use of the selected capacitors. According to at least one embodiment of the present invention, a simple addition of the capacitance controlling function such as the capacitor selecting switches to a conventional D/A converter achieves the adaptive control of a feedback amount responsive to the detected magnitude. The capacitor selecting switches may be implemented by use of MOS transistors, so that the number of the additional circuit elements is small, and the increase in circuit size is extremely small. Also, there is almost no increase in power consumption. Further, the D/A converter implemented in such a manner can operate at as high speed as the conventional D/A converter.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 2:
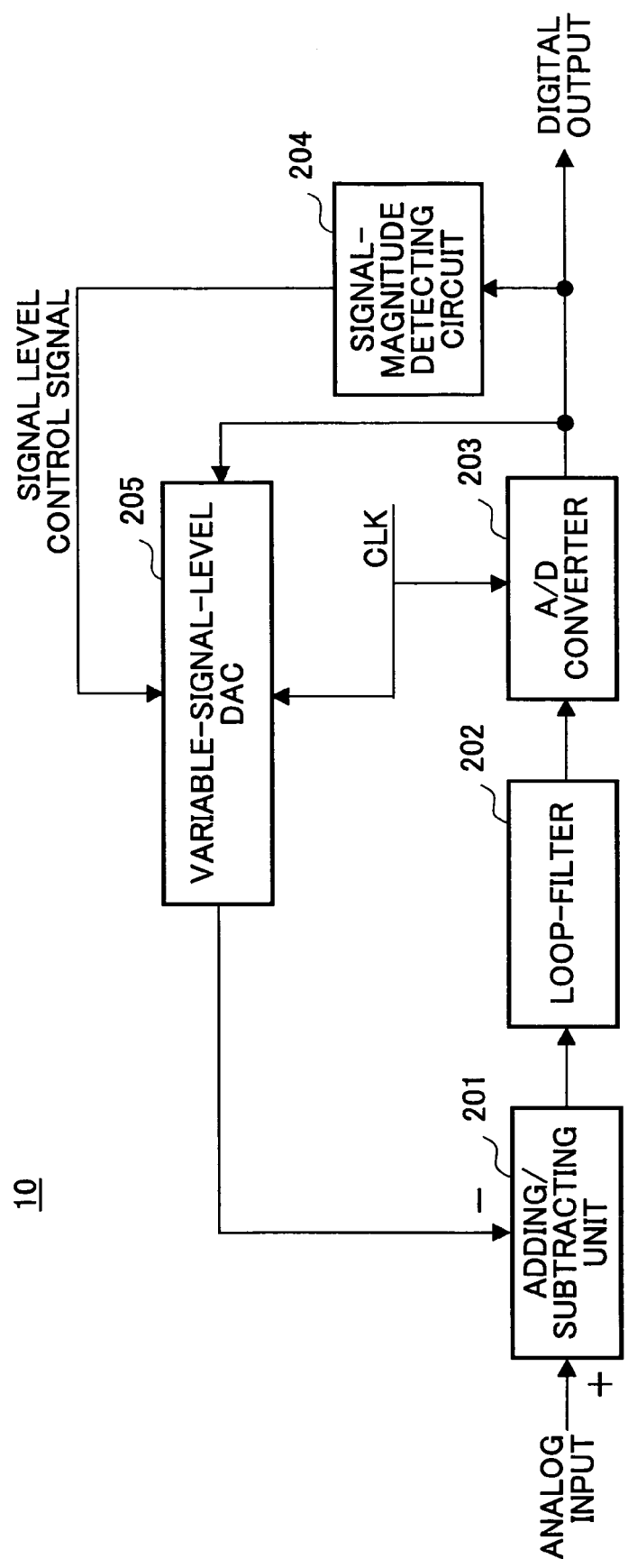
FIG. 2 is a diagram showing the construction of an adaptive-type sigma-delta A/D converter to which the present invention is applied.

FIG. 2 is a diagram showing the construction of an adaptive-type sigma-delta A/D converter to which the present invention is applied. A sigma-delta A/D converter 10 of FIG. 2 includes an adding/subtracting unit 201, a loop-filter 202, an A/D converter 203, a signal-magnitude detecting circuit 204, and a variable-signal-level D/A converter (variable-signal-level DAC) 205. The A/D converter 203 and the variable-signal-level D/A converter 205 operate based on a clock signal CLK. The variable-signal-level D/A converter 205 performs a D/A conversion with respect to the digital output signal for provision as an analog feedback signal to the adding/subtracting unit 201. The adding/subtracting unit 201 obtains a differential between the analog input signal and the feedback signal to supply the differential signal to the A/D converter 203. The loop-filter 202 is a low-pass filter, and has the function to integrate the differential signal supplied from the A/D converter 203. The integrated signal made by integrating the differential signal is supplied from the loop-filter 202 to the A/D converter 203. The A/D converter 203 performs an A/D conversion with respect to the integrated signal for provision as a digital signal output.

The differential signal output from the adding/subtracting unit 201 corresponds to a difference between the input signal and the output signal that is left unrepresented by the limited number of bits of the digital output signal. When an accumulation of this difference grows in the integrated signal, the digital signal output of the A/D converter 203 changes at some point in time. The time period required for the accumulation of the difference and the subsequent change is reciprocal to the difference between the input signal and the output signal that is left unrepresented by the limited number of bits of the digital output signal. Accordingly, a temporal average of the digital output signal of the A/D converter 203 can represent the analog input signal with the precision that exceeds precision achievable by the limited number of bits of the digital output signal. Namely, with the provision of the digital output signal at an over-sampling rate and the averaging of the signal by use of a FIR low-pass filter, it is possible to provide an A/D converter output with the precision commensurate with the over-sampling rate.

Figure 1A:
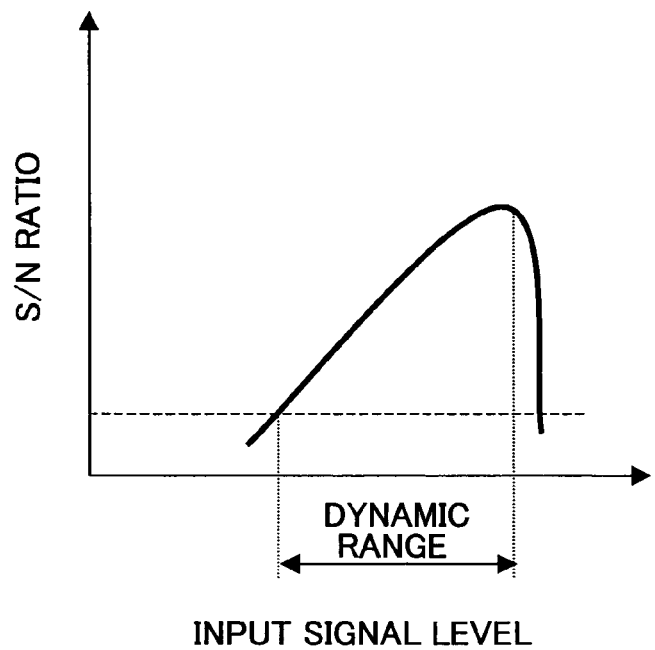
FIGS. 1A and 1B are drawings showing the dynamic range of a sigma-delta A/D converter.

If the amount of the DAC feedback by the variable-signal-level D/A converter 205 is fixed, the dynamic range of the sigma-delta A/D converter 10 would be the same as that shown in FIG. 1A. In the construction shown in FIG. 2, the signal-magnitude detecting circuit 204 detects the magnitude of the digital output signal of the A/D converter 203 (i.e., the A/D-converted value of the analog input signal represented by the digital output), and adjusts the signal level of the DAC feedback of the variable-signal-level D/A converter 205 in response to the detected magnitude.

Figure 1B:
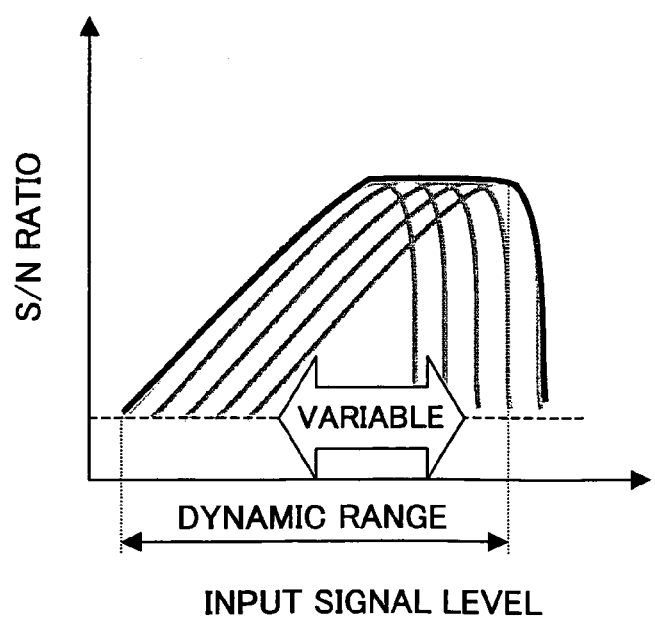

Namely, the amount of the DAC feedback is reduced if the analog input signal level becomes low, thereby suppressing quantization noise comparatively. Further, the amount of the DAC feedback is increased if the analog input signal level becomes high, thereby shifting the properly operable range toward a higher analog input signal level. This achieves a wider dynamic range adaptively as shown in FIG. 1B.

Figure 3:
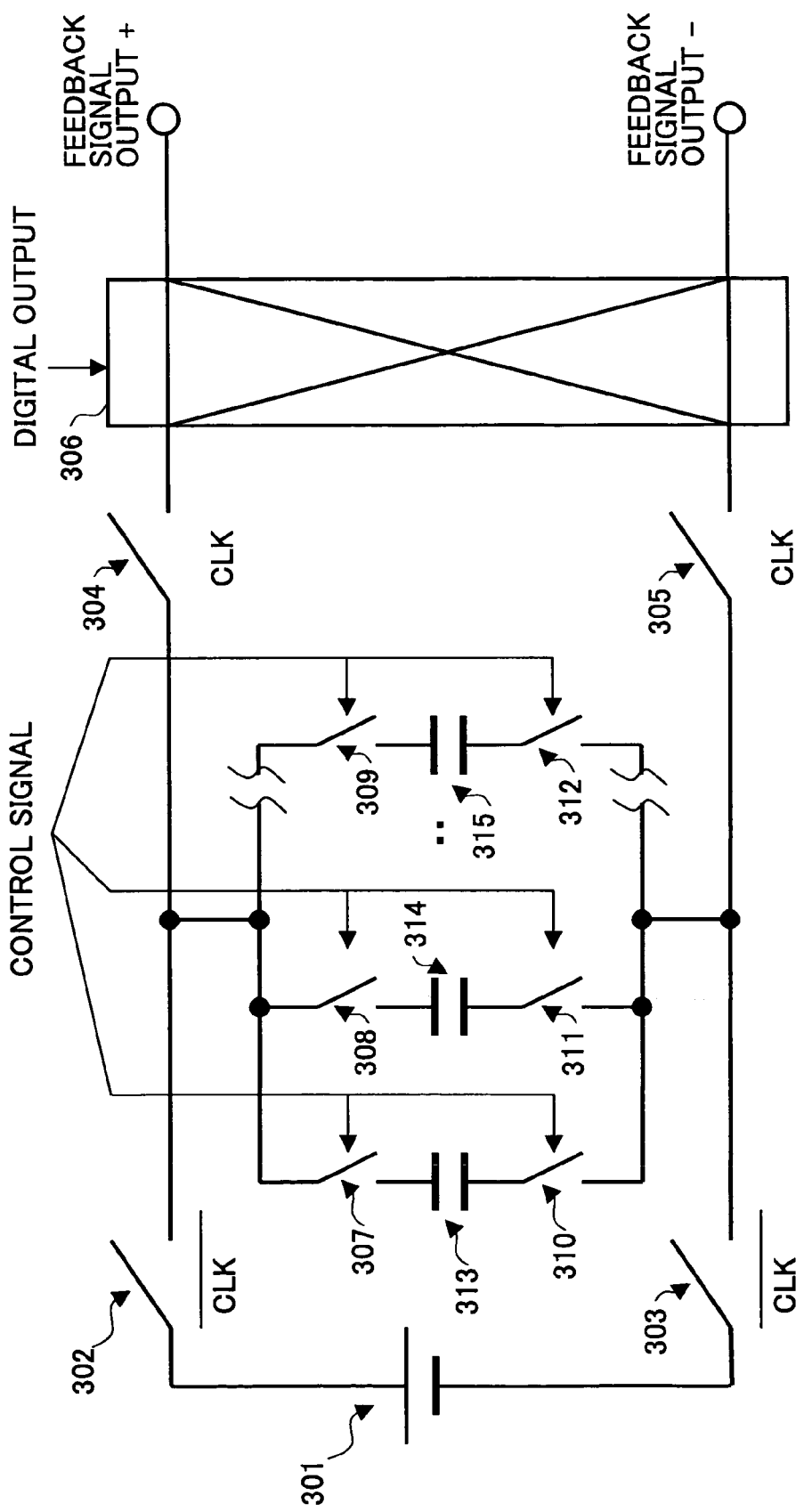
FIG. 3 is a circuit diagram showing the construction of a first embodiment of a variable-signal-level D/A converter according to the present invention.

FIG. 3 is a circuit diagram showing the construction of a first embodiment of the variable-signal-level D/A converter 205 according to the present invention. The variable-signal-level D/A converter 205 of FIG. 3 includes a charge-purpose reference potential source 301, charging/discharging changeover switches 302 through 305, a straight/cross switching unit 306, capacitor selecting switches 307 through 312, and capacitors 313 through 315.

The on/off states of the capacitor selecting switches 307 through 312 are controlled based on control signals responsive to the detected magnitude that is supplied from the signal-magnitude detecting circuit 204. To be specific, the number of the on-state switches increases as the detected magnitude rises, and decreases as the detected magnitude falls.

During the period in which the clock signal CLK is LOW, the switches 302 and 303 are closed. As a result, electric charge from the charge-purpose reference potential source 301 is supplied to the capacitors selected from the capacitors 313 through 315 by the capacitor selecting switches 307 through 312. Further, the connections between the inputs and outputs of the straight/cross switching unit 306 are set to straight connections or cross connections in response to the digital output value supplied from the A/D converter 203, thereby controlling the sign of the feedback signal output. To be specific, the plus side and minus side of the feedback signal output are exchanged, depending on whether the bit value of the one-bit digital output supplied from the A/D converter 203 is "0" or "1". This switches the feedback signal output between the positive sign and the negative sign.

AS the clock signal CLK changes to HIGH, the switches 302 and 303 are opened, resulting in the capacitors being disconnected from the reference potential source 301. Further, the switches 304 and 305 are closed, so that the capacitors having electric charge accumulated therein are coupled to the inputs of the straight/cross switching unit 306. As a result, the electric charge accumulated in the capacitors is supplied to the adding/subtracting unit 201 via the straight/cross switching unit 306.

As previously described, a rise in the detected magnitude prompts an increase in the number of the on-state switches among the capacitor selecting switches 307 through 312, thereby increasing the number of the capacitors in which electric charge is accumulated. This achieves an increased capacitance, thereby increasing the amount of electric charge, i.e., the amount of an electric current, supplied from the variable-signal-level D/A converter 205 to the adding/subtracting unit 201. Further, a fall in the detected magnitude decreases the number of the on-state switches among the capacitor selecting switches 307 through 312, thereby decreasing the number of the capacitors in which electric charge is accumulated. This achieves a decreased capacitance, thereby decreasing the amount of electric charge, i.e., the amount of an electric current, supplied from the variable-signal-level D/A converter 205 to the adding/subtracting unit 201. The adding/subtracting unit 201 subtracts the voltage responsive to the current amount from the analog input voltage so as to generate a differential between the output voltage and the input voltage.

The D/A converter for providing a feedback used in an non-adaptive-type sigma-delta A/D converter has substantially the same construction as the variable-signal-level D/A converter 205 shown in FIG. 3. The only difference is that D/A converter for providing a feedback in the non-adaptive-type sigma-delta A/D converter does not have the capacitor selecting switches 307 through 312. The present invention simply adds the capacitor selecting switches 307 through 312 to the conventional D/A converter to achieve the adaptive control of a feedback amount responsive to the detected magnitude. The capacitor selecting switches 307 through 312 may be implemented by use of MOS transistors, so that the number of the additional circuit elements is small, and the increase in circuit size is extremely small. Also, there is almost no increase in power consumption. Further, the variable-signal-level D/A converter 205 can operate at as high speed as the conventional D/A converter.

Figure 4:
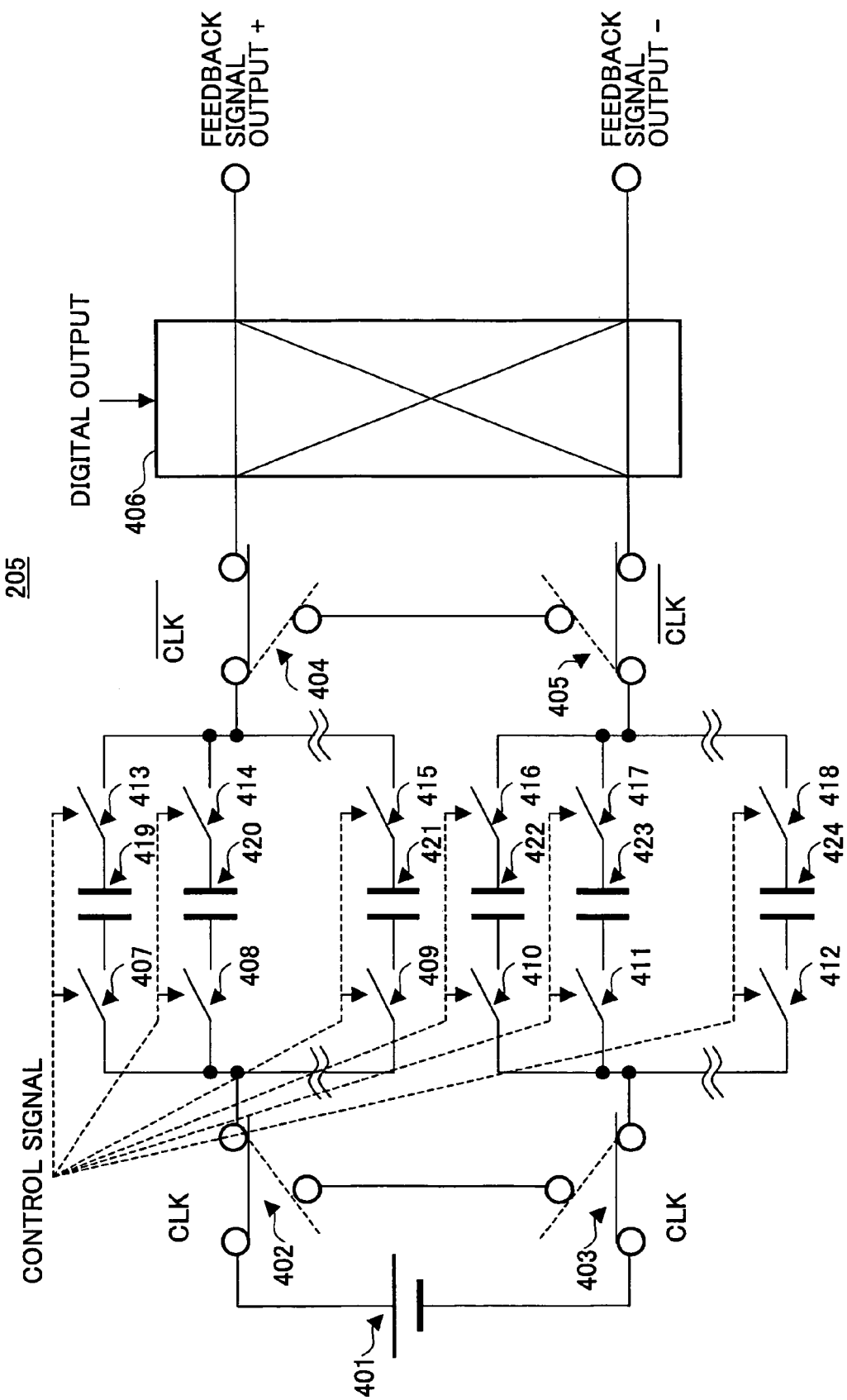
FIG. 4 is a circuit diagram showing the construction of a second embodiment of the variable-signal-level D/A converter.

FIG. 4 is a circuit diagram showing the construction of a second embodiment of the variable-signal-level D/A converter 205. The variable-signal-level D/A converter 205 shown in FIG. 4 includes a charge-purpose reference potential source 401, charging/discharging changeover switches 402 through 405, a straight/cross switching unit 406, capacitor selecting switches 407 through 418, and capacitors 419 through 424.

The on/off states of the capacitor selecting switches 407 through 418 are controlled based on control signals responsive to the detected magnitude that is supplied from the signal-magnitude detecting circuit 204. To be specific, the number of the on-state switches increases as the detected magnitude rises, and decreases as the detected magnitude falls.

During the period in which the clock signal CLK is LOW, the switches 402 and 403 are positioned as illustrated by solid lines, and the switches 404 and 405 are positioned as illustrated by doted lines. As a result, electric charge from the reference potential source 401 is supplied to the capacitors selected from the capacitors 419 through 424 by the capacitor selecting switches 407 through 418. Further, the connections between the inputs and outputs of the straight/cross switching unit 406 are set to straight connections or cross connections in response to the digital output value supplied from the A/D converter 203, thereby controlling the sign of the feedback signal output. To be specific, the plus side and minus side of the feedback signal output are exchanged, depending on whether the bit value of the one-bit digital output supplied from the A/D converter 203 is "0" or "1". This switches the feedback signal output between the positive sign and the negative sign.

AS the clock signal CLK changes to HIGH, the switches 402 and 403 are positioned as illustrated by dotted lines, and the switches 404 and 405 are positioned as illustrated by the solid lines, resulting in the capacitors being disconnected from the reference potential source 401 and coupled to the inputs of the straight/cross switching unit 406. As a result, the electric charge accumulated in the capacitors is supplied to the adding/subtracting unit 201 via the straight/cross switching unit 406.

As previously described, a rise in the detected magnitude prompts an increase in the number of the capacitors in which electric charge is accumulated. This achieves an increased capacitance, thereby increasing the amount of electric charge, i.e., the amount of an electric current, supplied from the variable-signal-level D/A converter 205 to the adding/subtracting unit 201. Further, a fall in the detected magnitude decreases the number of the capacitors in which electric charge is accumulated. This achieves a decreased capacitance, thereby decreasing the amount of electric charge, i.e., the amount of an electric current, supplied from the variable-signal-level D/A converter 205 to the adding/subtracting unit 201. The adding/subtracting unit 201 subtracts the voltage responsive to the current amount from the analog input voltage so as to generate a differential between the output voltage and the input voltage.

As described above in connection with the first embodiment shown in FIG. 3 or the second embodiment shown in FIG. 4, if the D/A converter has the construction in which the feedback signal is supplied by the charging/discharging of capacitors, a mere addition of capacitance selecting switches as shown in FIG. 3 or FIG. 4 makes it possible to provide the function to control the amount of the DAC feedback.

Figure 5:
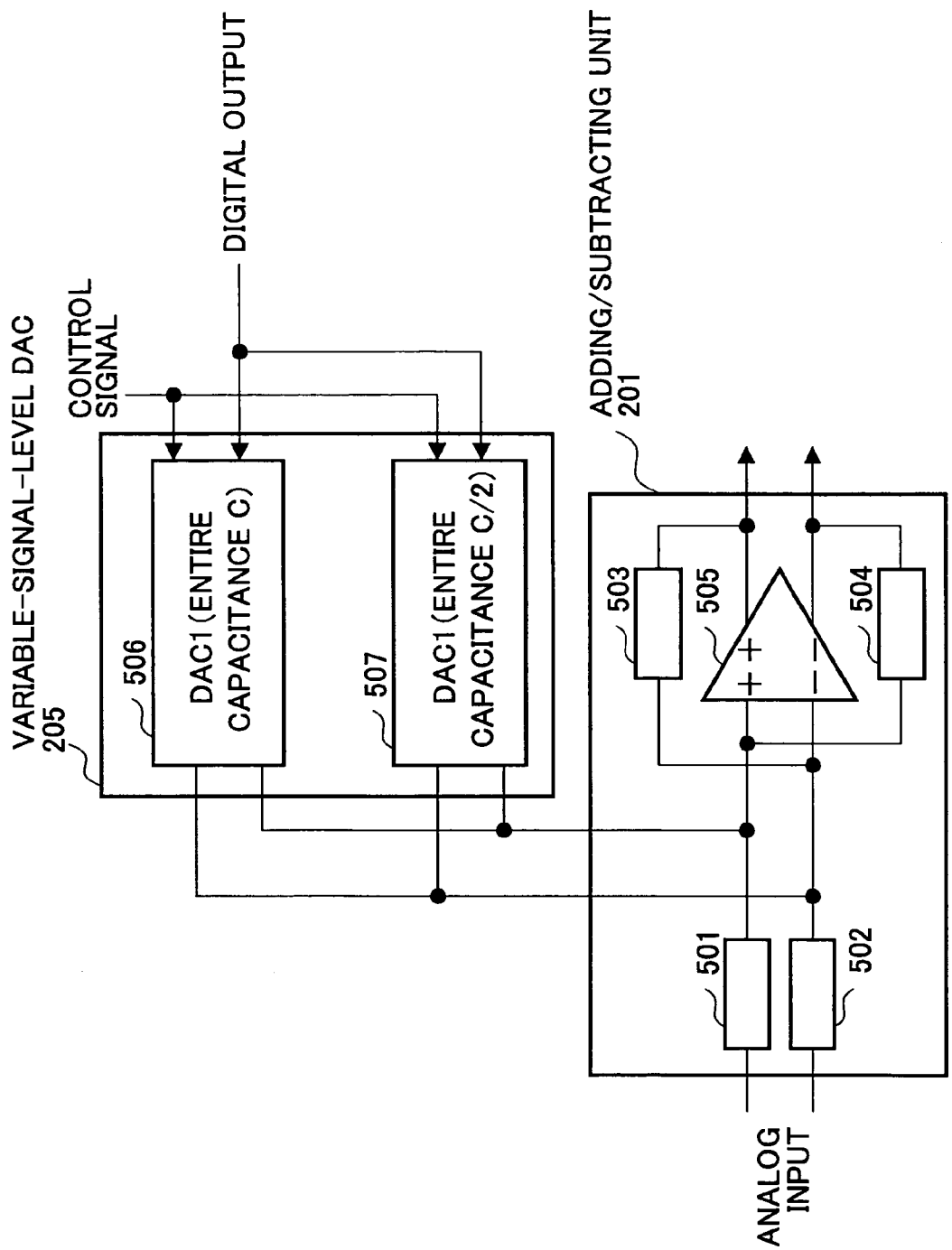
FIG. 5 is a drawing showing the construction of a third embodiment of the variable-signal-level D/A converter.

FIG. 5 is a drawing showing the construction of a third embodiment of the variable-signal-level D/A converter 205. The third embodiment corresponds to the construction in which the A/D converter 203 has two-bit outputs. The variable-signal-level D/A converter 205 includes a D/A converter 506 (DAC2) and a D/A converter 507 (DAC1). Each of the D/A converter 506 and the D/A converter 507 may have the same configuration as the variable-signal-level D/A converter illustrated in FIG. 3 or FIG. 4, for example. With the entire capacitance for supplying electric charge in the D/A converter 506 being denoted as C, the entire capacitance for supplying electric charge in the D/A converter 507 is set equal to C/2.

The D/A converter 506 is provided with an operation enable function. FIG. 5 also illustrates the construction of the adding/subtracting unit 201. The adding/subtracting unit 201 includes input impedances 501 and 502, feedback impedances 503 and 504, and an operational amplifier 505. Each of the D/A converter 506 and the D/A converter 507 has its plus-side output supplied to the non-inverted input of the operational amplifier 505, and has its minus-side output supplied to the inverted input of the operational amplifier 505.

The two bits of the digital output supplied from the A/D converter 203 are supplied to the D/A converter 506. The D/A converter 506 is provided with the operation enable function, so that it operates to output the feedback signal only when the two bits of the digital output are "00" or "11". Further, the straight/cross switching unit of the D/A converter 506 switches between the straight setting and the cross setting in response to the bit value of the upper-order bit (or lower-order bit) of the digital output. To be specific, a negative feedback signal is output when the upper-order bit (or lower-order bit) of the digital output is "0", and a positive feedback signal is output when the upper-order bit (or lower-order bit) of the digital output is "1".

The D/A converter 507 receives only the upper-order bit of the digital output, and controls its straight/cross switching unit according to this received bit. To be specific, a negative feedback signal is output when the upper-order bit of the digital output is "0", and a positive feedback signal is output when the upper-order bit of the digital output is "1".

Figures 6, 7:
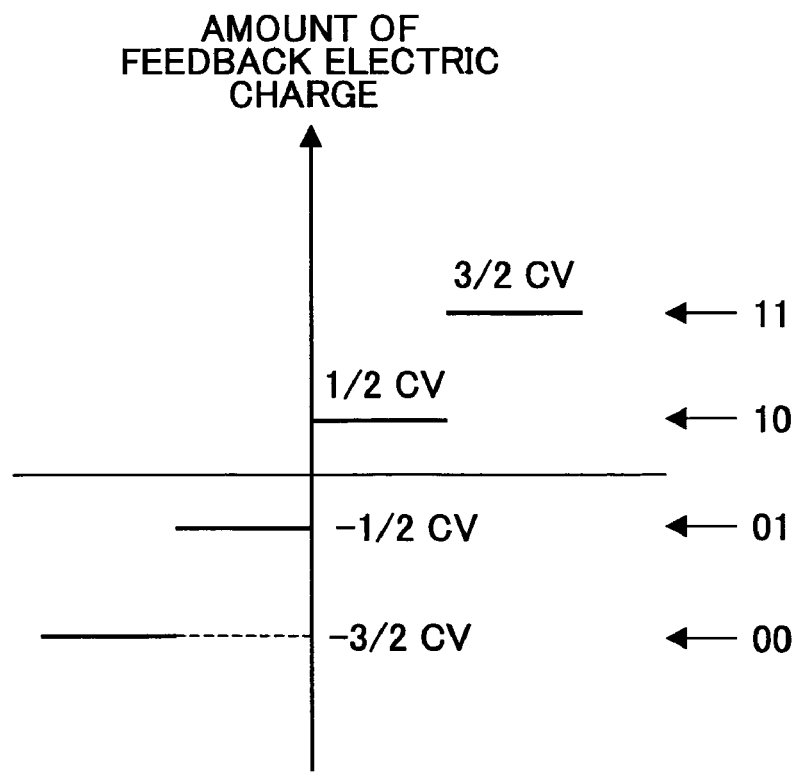
FIG. 6 is a drawing showing the relationship between the value of a digital output and the operation of two D/A converters.
FIG. 7 is an illustrative drawing showing the output of the variable-signal-level D/A converter shown in FIG. 5.

FIG. 6 is a drawing showing the relationship between the value of the digital output and the operation of the two D/A converters. The D/A converter 506 (DAC2) and the D/A converter 507 (DAC1) are controlled according to the values of the individual bits of the digital output as described above, thereby achieving the operations as illustrated in FIG. 6.

Namely, if the digital output is "00", both DAC1 and DAC2 are selected (operate), so that DAC1 and DAC2 output negative-sign feedback signals. If the digital output is "01", only DAC1 is selected (operates), so that DAC1 outputs a negative-sign feedback signal. If the digital output is "10", only DAC1 is selected (operates), so that DAC1 outputs a positive-sign feedback signal. If the digital output is "11", both DAC1 and DAC2 are selected (operate), so that DAC1 and DAC2 output positive-sign feedback signals.

FIG. 7 is an illustrative drawing showing the output of the variable-signal-level D/A converter 205 shown in FIG. 5. As illustrated in FIG. 7, electric charge in the amount of $-(3/2)CV$ is fed back in response to the digital output "00", electric charge in the amount of $-(1/2)CV$ fed back in response to the digital output "01", electric charge in the amount of $+(1/2)CV$ fed back in response to the digital output "10", and electric charge in the amount of $+(3/2)CV$ fed back in response to the digital output "11". Here, C is the capacitance of the D/A converter 506 (DAC2), and V is the voltage of the reference potential source (see FIG. 3 or FIG. 4). In this manner, it is possible to supply as a feedback signal the amount of electric charge varying from $-(3/2)CV$ to $+(3/2)CV$ in response to the four respective levels of the digital output.

Figure 8:
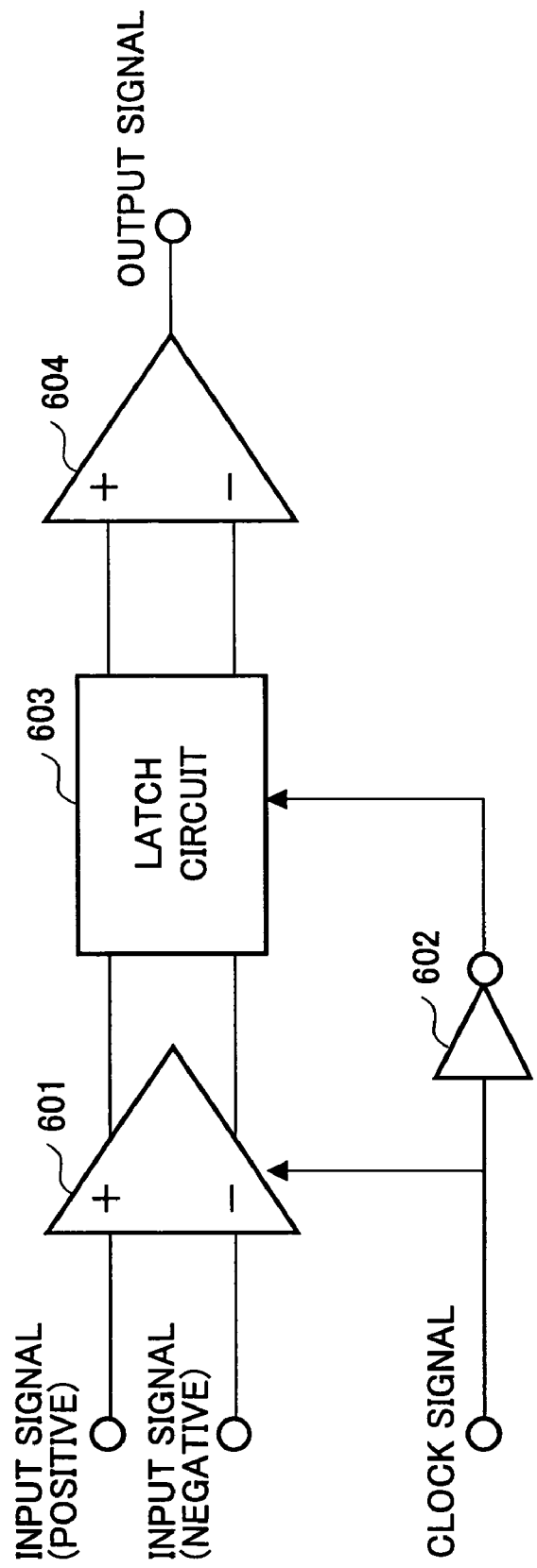
FIG. 8 is a circuit diagram showing the construction of a 1-bit A/D converter (comparator) serving as a basic element of an A/D converter.

FIG. 8 is a circuit diagram showing the construction of a 1-bit A/D converter (comparator) serving as a basic element of the A/D converter 203. The A/D converter 203 of FIG. 8 includes a preamplifier 601, an inverter 602, a latch circuit 603, and a buffer 604. A clock signal is supplied to the preamplifier 601, and the clock signal inverted by the inverter 602 is supplied to the latch circuit 603. The preamplifier 601 amplifies a difference between the positive node and the negative node to which an input signal is applied, and supplies the amplified signal to the latch circuit 603. The latch circuit 603 latches the amplified signal in synchronization with the inverted clock signal so as to achieve a signal determining operation. Namely, the latch circuit 603 latches HIGH if the amplified signal is above a predetermined level, and latches LOW if the amplified signal is below the predetermined level. The latched content of the latch circuit 603 is transmitted as the digital output signal after buffering by the buffer 604.

Figure 9:
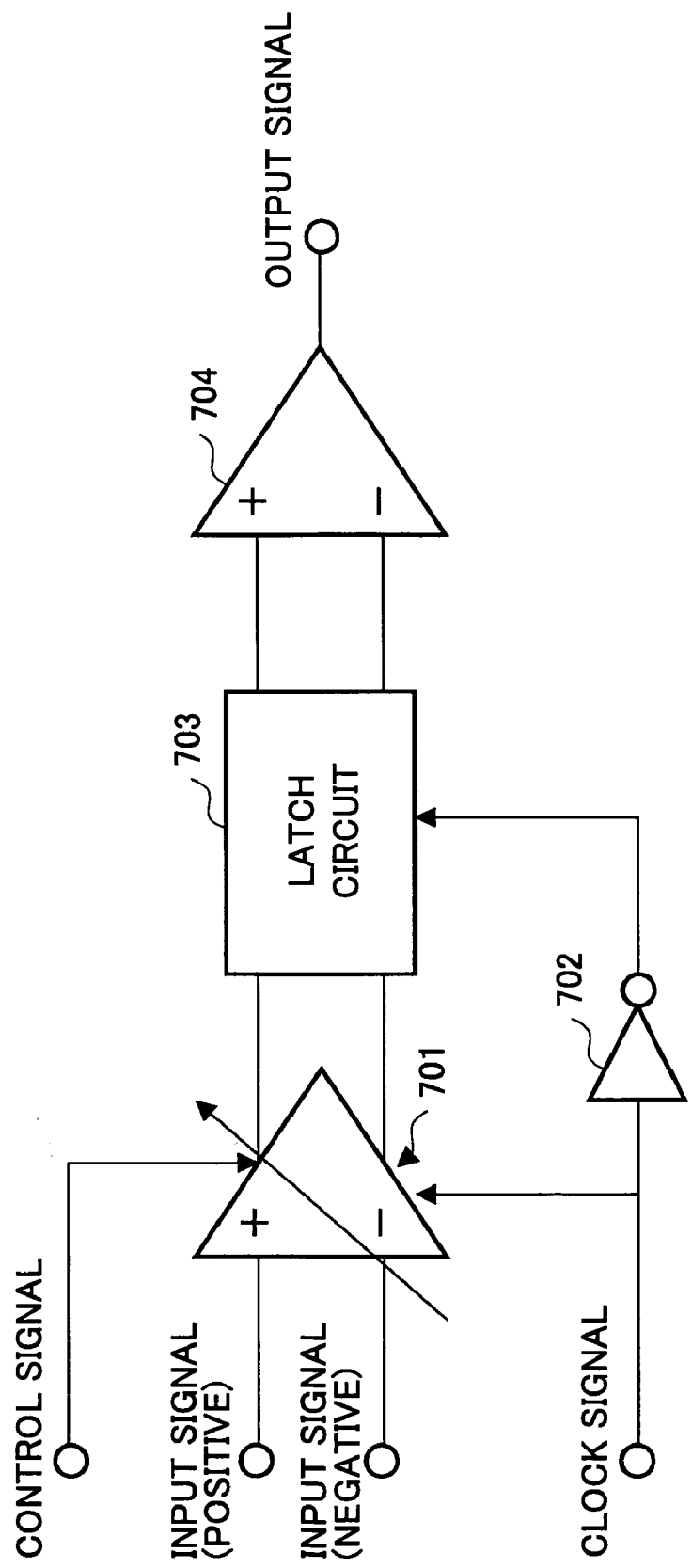
FIG. 9 is a circuit diagram showing a variation of the construction of the 1-bit A/D converter (comparator) serving as a basic element of the A/D converter.

FIG. 9 is a circuit diagram showing a variation of the construction of the 1-bit A/D converter (comparator) serving as a basic element of the A/D converter 203. The A/D converter 203 of FIG. 9 includes a variable-gain preamplifier 701, an inverter 702, a latch circuit 703, and a buffer 704. In the construction shown in FIG. 9, a control signal for controlling the amount of the DAC feedback serves to control the gain of the variable-gain preamplifier 701. With the provision that makes the gain of the variable-gain preamplifier 701 variable, it is possible to optimize the power consumption. If the amount of the DAC feedback is small, the signal input to the variable-gain preamplifier 701 is also small. In this case, thus, the amplifier gain needs to be boosted to raise the precision of the comparator determination. If the amount of the feedback is large, on the other hand, there is no need to provide high precision for comparator determination. In this case, therefore, the amplifier gain is dropped to reduce the power consumption.

Figure 10:
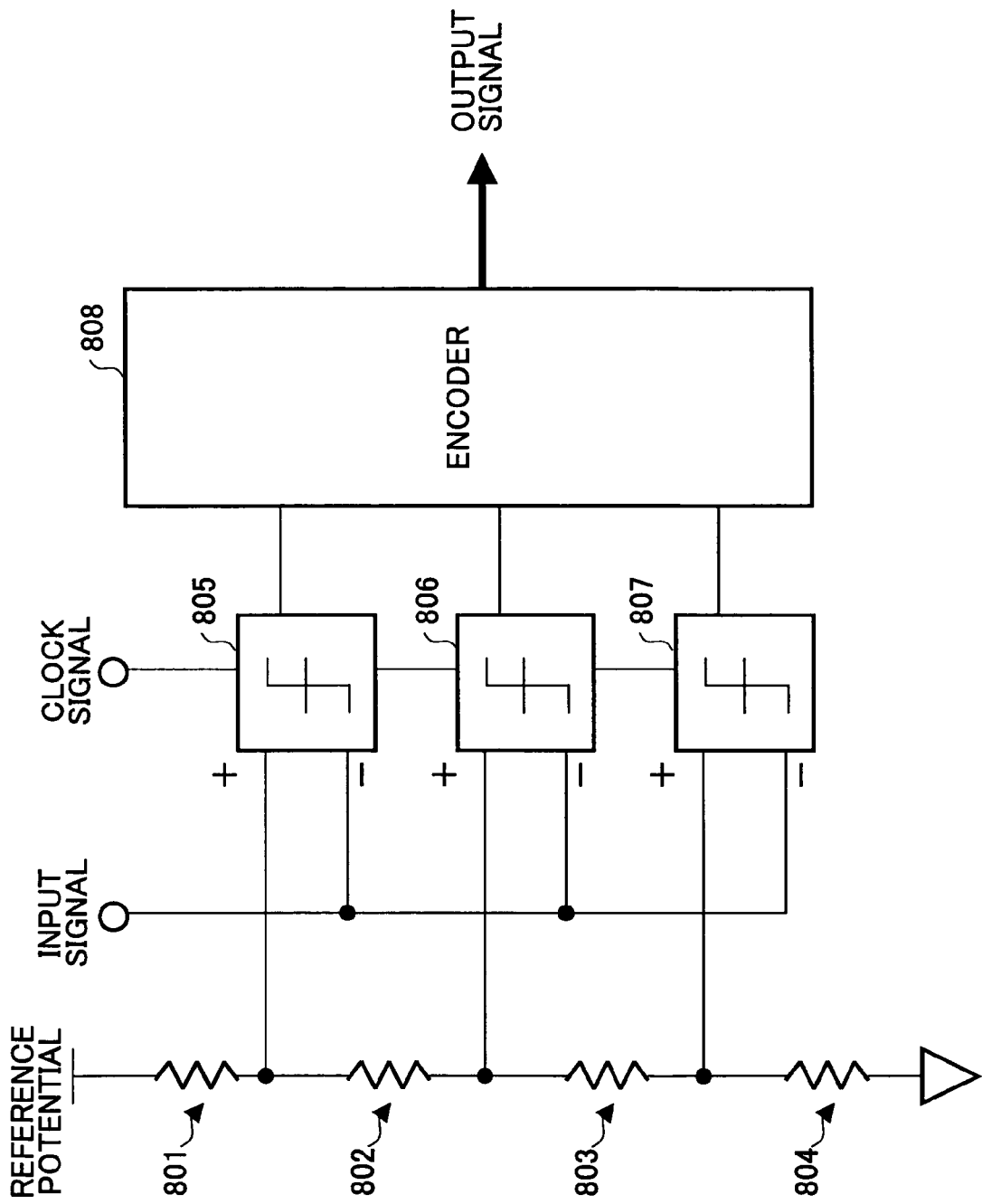
FIG. 10 is a drawing showing the circuit construction of the A/D converter in the case of a multiple-bit digital output signal.

FIG. 10 is a drawing showing the circuit construction of the A/D converter 203 in the case of a multiple-bit digital output signal. FIG. 10 shows a case in which the digital output signal is comprised of two bits.

The A/D converter 203 of FIG. 10 includes resistors 801 through 804, 1-bit A/D converters (comparators) 805 through 807, and an encoder 808. The resistors 801 through 804 each have the same resistance, and are connected in series to constitute a potential divider. Three reference potentials divided and generated by the potential divider are supplied to the respective 1-bit A/D converters 805 through 807.

Each of the 1-bit A/D converters 805 through 807 may have the construction shown in FIG. 8 or FIG. 9, for example. Each of the 1-bit A/D converters 805 through 807 compares the corresponding reference potential and the potential of the input signal, thereby supplying a 1-bit digital signal indicative of the result of the comparison to the encoder 808. The encoder 808 encodes the 3-bit signal supplied from the 1-bit A/D converters 805 through 807 to output a 2-bit digital output signal. This output signal indicates which one of the four states is selected so that the input signal is quantized into a value corresponding to the selected state.

Further, the present invention is not limited to these embodiments, but various variations and modifications may be made without departing from the scope of the present invention.

The present application is based on Japanese priority application No. 2004-326578 filed on Nov. 10, 2004, with the Japanese Patent Office, the entire contents of which are hereby incorporated by reference.

What is claimed is:

1. A sigma-delta A/D converter, comprising:
an A/D converter configured to output a digital signal;
a signal-magnitude detecting circuit coupled to the output of said A/D converter to output a control signal responsive to a magnitude indicated by the digital signal;
a D/A converter coupled to the output of said A/D converter and the output of said signal-magnitude detecting circuit to output an analog signal having a signal level responsive to the digital signal and the control signal;
a differential circuit coupled to an external analog input and the output of said D/A converter to output a differential between the external analog input and the analog signal; and
a filter circuit to couple between the output of said differential circuit and an input of said A/D converter, wherein said D/A converter is configured to control, in response to the control signal, a capacitance of a capacitor that discharges following charging of electric charge to supply an electric current of said analog signal,
and wherein said A/D converter includes an amplifier configured to amplify a signal input from said filter circuit, said amplifier configured to change a gain in response to the magnitude indicated by the digital signal.

2. The sigma-delta A/D converter as claimed in claim 1, wherein said D/A converter includes:
a plurality of capacitors configured to discharge following charging of electric charge; and
a capacitor selecting circuit configured to select capacitors, from said plurality of capacitors, as many as indicated by the control signal and to supply the electric current of the analog signal by a discharge from the selected capacitors.

3. The sigma-delta A/D converter as claimed in claim 2, wherein said capacitor selecting circuit is a switch circuit that controls couplings between the output of said D/A converter for outputting the analog signal and said plurality of capacitors.

4. A sigma-delta A/D converter, comprising:
an A/D converter configured to output a digital signal;
a signal-magnitude detecting circuit coupled to the output of said A/D converter to output a control signal responsive to a magnitude indicated by the digital signal;
a D/A converter coupled to the output of said A/D converter and the output of said signal-magnitude detecting circuit to output an analog signal having a signal level responsive to the digital signal and the control signal;
a differential circuit coupled to an external analog input and the output of said D/A converter to output a differential between the external analog input and the analog signal; and
a filter circuit to couple between the output of said differential circuit and an input of said A/D converter, wherein said D/A converter is configured to control, in response to the control signal, a capacitance of a capacitor that discharges following charging of electric charge to supply an electric current of said analog signal,
wherein said D/A converter includes:
a plurality of capacitors configured to discharge following charging of electric charge; and
a capacitor selecting circuit configured to select capacitors, from said plurality of capacitors, as many as indicated by the control signal and to supply the electric current of the analog signal by a discharge from the selected capacitors,
wherein said D/A converter further includes a switching unit configured to switch, in response to the digital signal, connections between a plus side and minus side of said plurality of capacitors and a plus side and minus side of the output of said D/A converter.

5. A sigma-delta A/D converter, comprising:
an A/D converter configured to output a digital signal;
a signal-magnitude detecting circuit coupled to the output of said A/D converter to output a control signal responsive to a magnitude indicated by the digital signal;
a D/A converter coupled to the output of said A/D converter and the output of said signal-magnitude detecting circuit to output an analog signal having a signal level responsive to the digital signal and the control signal;

a differential circuit coupled to an external analog input and the output of said D/A converter to output a differential between the external analog input and the analog signal; and a filter circuit to couple between the output of said differential circuit and an input of said A/D converter, wherein said D/A converter is configured to control, in response to the control signal, a capacitance of a capacitor that discharges following charging of electric charge to supply an electric current of said analog signal, and wherein the digital signal output from said A/D converter is comprised of a plurality of bits, and said D/A converter is configured to output as the analog signal an electric current having an amount responsive to a digital value represented by said plurality of bits; wherein said A/D converter includes an amplifier configured to amplifying a signal input from said filter circuit, said amplifier configured to change a gain in response to the magnitude indicated by the digital signal.

6. A sigma-delta A/D converter having a single-loop configuration in which a digital output signal responsive to an analog input signal is fed back as an analog signal by a D/A converter, wherein said D/A converter includes a capacitor for supplying an electric current of the analog signal by charging/discharging of electric charge, and is configured to control a capacitance of said capacitor in response to a magnitude indicated by the digital output signal, said sigma-delta A/D converter comprising an amplifier configured to amplify the analog input signal, said amplifier configured to change a gain in response to the magnitude indicated by the digital signal.

7. The sigma-delta A/D converter as claimed in claim 6, wherein the magnitude indicated by the digital output signal is a value obtained by A/D conversion of a signal level of the analog input signal as represented by the digital output signal.

* * * * *